(12) United States Patent
Zhang et al.

(10) Patent No.: US 11,139,410 B1
(45) Date of Patent: Oct. 5, 2021

(54) SOLAR CELL STRUCTURE WITH BACK SURFACE REFLECTOR

(75) Inventors: Xiaobo Zhang, Arcadia, CA (US); Kenneth M. Edmondson, Los Angeles, CA (US); Daniel C. Law, Arcadia, CA (US); Shoghig Mesropian, Tarzana, CA (US)

(73) Assignee: The Boeing Company, Chicago, IL (US)

( * ) Notice: Subject to any disclaimer, the term of this patent is extended or adjusted under 35 U.S.C. 154(b) by 1528 days.

(21) Appl. No.: 12/830,670

(22) Filed: Jul. 6, 2010

(51) Int. Cl.
*H01L 31/042* (2014.01)
*H01L 31/056* (2014.01)
*H01L 31/0687* (2012.01)
*H01L 31/0392* (2006.01)
*H01L 31/054* (2014.01)

(52) U.S. Cl.
CPC ...... *H01L 31/056* (2014.12); *H01L 31/03926* (2013.01); *H01L 31/054* (2014.12); *H01L 31/0687* (2013.01); *H01L 31/06875* (2013.01); *Y02E 10/52* (2013.01)

(58) Field of Classification Search
CPC ............ H01L 31/048; H01L 31/0487; H01L 31/0527; H01L 31/0735; H01L 31/056; H01L 31/054; H01L 31/0687; H01L 31/06875; H01L 31/0926; Y01E 10/52
USPC .................................................. 136/243–293
See application file for complete search history.

(56) References Cited

U.S. PATENT DOCUMENTS

| | | | |
|---|---|---|---|
| 4,166,919 A * | 9/1979 | Carlson | 136/257 |
| 4,497,974 A * | 2/1985 | Deckman et al. | 136/259 |
| 4,612,409 A * | 9/1986 | Hamakawa et al. | 136/244 |
| 4,773,945 A | 9/1988 | Woolf et al. | |
| 5,296,045 A * | 3/1994 | Banerjee | H01L 31/0236 136/249 |
| 2004/0007777 A1* | 1/2004 | Kono et al. | 257/758 |
| 2004/0166681 A1* | 8/2004 | Iles | H01L 31/0687 438/689 |
| 2006/0157103 A1* | 7/2006 | Sheats | H01L 27/3204 136/244 |
| 2007/0042167 A1* | 2/2007 | Fujihara | B29C 55/143 428/209 |
| 2007/0160747 A1* | 7/2007 | Mitzi | H01L 21/02628 427/74 |
| 2007/0180916 A1* | 8/2007 | Tian et al. | 73/649 |
| 2010/0093127 A1 | 4/2010 | Sharps et al. | |

OTHER PUBLICATIONS

Yoon, H. et al., "Progress of Inverted Metamorphic III-V Solar Cell Development at Spectrolab," Proceedings of 33rd IEEE PVSC, 2008.
Cornfeld, A.B. et al., The 3J-IMM Solar Cell: Pathways for Insertion Into Space Power Systems, 34th IEEE PVSC, 2009.
Danzilio, D., "Overview of EMCORE's Multi-junction Solar Cell Technology and High Volume Manufacturing Capabilities," CS MANTECH Conference, Austin, Texas (May 14-17, 2007).
Niklaus, F. et al., "Adhesive Wafer Bonding," *Journal of Applied Physics*, 99, 031101 (2006).

* cited by examiner

Primary Examiner — Thanh Truc Trinh
(74) Attorney, Agent, or Firm — Vivacqua Crane

(57) ABSTRACT

A solar cell structure including a solar cell having a front surface and a back surface, a reflective layer disposed proximate the back surface and a flexible support layer disposed between the back surface and the reflective layer.

18 Claims, 4 Drawing Sheets

SOLAR CELL STRUCTURE WITH BACK SURFACE REFLECTOR

GOVERNMENT CONTRACT

This invention was made with Government support under FA9453-09-C-0373 awarded by the United States Air Force. The Government of the United States may have certain rights in this invention.

FIELD

This application relates to solar cell structures and, more particularly, to solar cell structures configured to increase efficiency and reduce heat accumulation and, even more particularly, to solar cell structures having a back surface reflector.

BACKGROUND

Advances in solar technology have led to the development of high efficiency solar cells that are thin and, hence, flexible. For example, inverted metamorphic ("IMM") solar cells have been constructed with cross-sectional thicknesses of less than 20 microns, and which are capable of being wrapped around a drum having a diameter of 10 inches.

The improvements in flexibility of solar cells have facilitated the deployment of solar cells in a variety of applications, including space applications. For example, thin, flexible solar cells may be used to form flexible solar cell panels capable of being wrapped around a spool when not deployed. Therefore, the flexibility of such solar cell panels facilitates minimizing the overall space required to stow such solar panels, which is particularly advantageous when launching space vehicles.

However, due to their reduced cross-sectional thickness, flexible solar cells are susceptible to developing cracks and breaks during processing and handling. For example, unsupported solar cells are particularly prone to cracks and breaks when subjected to the forces of a space launch. Such cracks and breaks can compromise the performance of the solar cell and overall solar cell panel.

Accordingly, those skilled in the art continue with research and development efforts seeking to improve the structural integrity and overall efficiency of solar cells.

SUMMARY

In one aspect, the disclosed solar cell structure may include a solar cell having a front surface and a back surface, a reflective layer disposed proximate the back surface and a flexible support layer disposed between the back surface and the reflective layer.

In another aspect, the disclosed solar cell structure may include a multi-junction solar cell having a front surface and a back surface, a metal film layer disposed proximate the back surface, the metal film layer having a reflectance of at least 90 percent at a wavelength of at least 750 nanometers, and a polyimide layer disposed between the back surface and the metal film layer, the polyimide having at least 90 percent optical transparency at a wavelength of greater than 900 nanometers.

In yet another aspect, disclosed is a method for manufacturing a solar cell structure. The method may include the steps of (1) providing a solar cell on a temporary substrate, the solar cell including a front surface and a back surface, the temporary substrate being connected to the front surface, (2) forming a flexible support layer on the back surface, (3) forming a reflective layer on the flexible support layer, (4) attaching a carrier to the reflective layer, (5) removing the temporary substrate from the front surface and (6) forming metal contacts and antireflection on the front surface.

Other aspects of the disclosed solar cell structure and method for manufacturing a solar cell structure will become apparent from the following description, the accompanying drawings and the appended claims.

DETAILED DESCRIPTION

Figure 1:
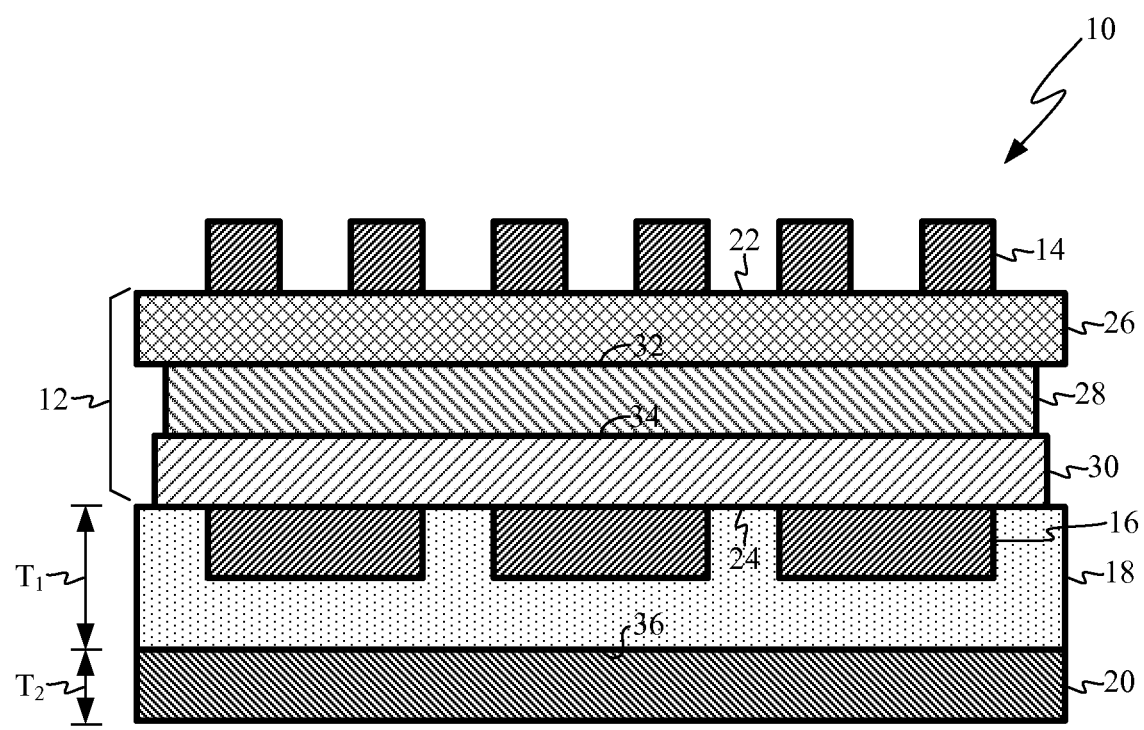
FIG. 1 is a schematic cross-sectional view of one aspect of the disclosed solar cell structure.

Referring to FIG. 1, one aspect of the disclosed solar cell structure, generally designated 10, may include a solar cell 12, one or more front contacts 14, one or more back contacts 16, a flexible support layer 18 and a reflective layer 20. Optionally, a second flexible support layer (not shown) may be used such that the reflective layer 20 is disposed between first 18 and second flexible support layers. Additional components and layers, such as a cover glass layer, an anti-reflective coating layer or the like, while not shown in the drawings, may be included without departing from the scope of the present disclosure.

The solar cell 12 may be any device that converts electromagnetic radiation, whether received from the sun or otherwise, into electrical energy. The solar cell 12 may include a front (e.g., sun) surface 22 having the front contacts 14 connected thereto and a back surface 24 having the back contacts 16 connected thereto. The solar cell 12 may produce a voltage across the front surface 22 and the back surface 24 when the front surface 22 is exposed to electromagnetic radiation, such as solar radiation.

In a first implementation, the solar cell 12 may be a high efficiency multi junction solar cell, such as a gallium arsenide ("GaAs") solar cell or an inverted metamorphic ("IMM") solar cell. In one general expression, the solar cell 12 may include at least one or more top subcells 26, one or more middle subcells 28 and one or more bottom subcells 30. A first junction 32 may be defined by the top 26 and the middle 28 subcells and a second junction 34 may be defined by the middle 28 and the bottom 30 subcells. In one specific example, the top subcell 26 may include GaInP, the middle subcell 28 may include GaAs and the bottom subcell 30 may include InGaAs.

In a second implementation, the solar cell 12 may be a traditional silicon-based solar cell.

The flexible support layer 18 may include one or more layers of support material positioned proximate the back surface 24 of the solar cell 12. The flexible support layer 18 may be directly adjacent to the back surface 24 of the solar cell 12 or one or more optional intermediate layers may be disposed between the flexible support layer 18 and the back surface 24 of the solar cell 12. The flexible support layer 18 may define a second back surface 36, which may be sufficiently smooth to receive and support the reflective layer 20.

The flexible support layer 18 may be formed from a support material having the required tensile strength and that may be substantially optically transparent. For example, the support material of the flexible support layer 18 may have a light absorption of at most 10 percent, such as at most 5 percent, in the relevant spectrum (e.g., wavelengths at or above 900 nanometers).

Furthermore, the support material of the flexible support layer 18 may be sufficiently flexible. For example, flexibility of the flexible support layer 18 may be such that the solar cell structure 10 may be wrapped around a cylindrical drum having a diameter of 20 inches, or even 15 inches or 10 inches, without experiencing naked-eye-detectable damage (e.g., cracking) in the flexible support layer 18.

Still furthermore, the support material of the flexible support layer 18 may have a coefficient of thermal expansion that closely matches the coefficient of thermal expansion of the solar cell 12. For example, the support material of the flexible support layer 18 may have a coefficient of thermal expansion that varies from the coefficient of thermal expansion of the solar cell 12 by at most 50 percent.

In one particular expression, the support material of the flexible support layer 18 may be or may include polyimide. One example of a suitable polyimide useful in the flexible support layer 18 is PI-2611 polyimide available from E. I. du Pont de Nemours and Company of Wilmington, Del. PI-2611 has a relatively low density, particularly compared to metallic support materials, a light absorption of about 1 to about 2 percent at wavelengths above 900 nanometers, and a coefficient of thermal expansion of about 3 ppm/° C., which is close to the typical coefficient of thermal expansion (e.g., 5-7 ppm/° C.) of IMM solar cell semiconductor materials. Other examples of suitable polyimide materials will become apparent to those skilled in the art.

The flexible support layer 18 may be applied to the solar cell 12 using various techniques, which may depend on, among other things, the type of support material used in the flexible support layer 18. For example, PI-2611 polyimide may be spin-coated onto the back surface 24 of the solar cell 12 and then cured in an oven at 350° C. for 30 minutes in an $N_2$ environment.

The flexible support layer 18 may have a cross-sectional thickness $T_1$, which may be measured from the back surface 24 of the solar cell 12 to the back surface 36 of the flexible support layer 18. The cross-sectional thickness $T_1$ may depend on, among other things, the type of support material used for the flexible support layer 18, the overall size of the solar cell 12 and/or the desired amount of flexibility. In one particular implementation, the flexible support layer 18 may have a cross-sectional thickness $T_1$ ranging from about 5 to about 20 microns.

The reflective layer 20 may include one or more layers of reflective material positioned proximate the back surface 36 of the flexible support layer 18 to reflect incoming radiation back to the solar cell 12. As such, the reflective layer 20 may have a sufficiently high reflectance at the wavelengths of interest. In a first expression, the reflective layer 20 may have a reflectance of at least 90 percent at wavelengths at and above 750 nanometers. In a second expression, the reflective layer 20 may have a reflectance of at least 95 percent at wavelengths at and above 750 nanometers. In a third expression, the reflective layer 20 may have a reflectance of at least 97 percent at wavelengths at and above 750 nanometers.

The reflective layer 20 may include one or a combination of reflective materials. Examples of suitable reflective materials for forming the reflective layer 20 include gold, silver and aluminum. Other suitable reflective materials will be apparent to those skilled in the art. In one particular expression, the reflective material may have a coefficient of thermal expansion that closely matches the coefficients of thermal expansion of the other components of the solar cell structure 10.

The reflective layer 20 may be applied using various techniques, which may depend on, among other things, the type of material used to form the reflective layer 20. For example, the reflective layer 20 may be a metal film layer and may be applied using standard metal deposition technology, such as e-beam evaporation or metal sputtering.

The reflective layer 20 may have a cross-sectional thickness $T_2$. While the cross-sectional thickness $T_2$ may depend on various factors, as an example, the cross-sectional thickness $T_2$ may range from about 0.1 to about 2 microns.

Thus, the flexible support layer 18 may mechanically support the solar cell structure 10, while the reflective layer 20 may redirect incoming electro-magnetic radiation that has passed through the solar cell 12 back to the solar cell 12, thereby potentially improving the operating efficiency of the solar cell 12 and minimizing heat accumulation.

In another aspect, the solar cell structure 10 may be manufactured using the steps illustrated in FIGS. 2-9. Other methods for manufacturing the disclosed solar cell structure 10 are also contemplated.

Figure 2:
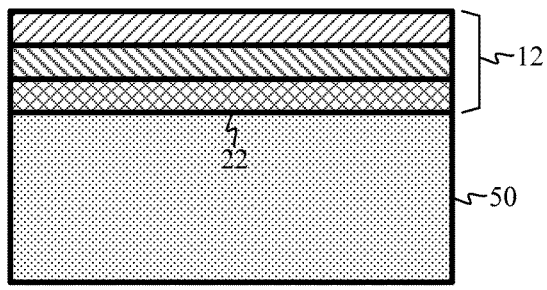
FIG. 2 is a schematic cross-sectional view of the solar cell structure of FIG. 1 during a first step of manufacture.

As shown in FIG. 2, the manufacturing method may begin by assembling the solar cell 12 on a temporary substrate 50. For example, an inverted metamorphic solar cell may be epitaxially grown on a single crystal germanium wafer substrate using metal-organic chemical vapor deposition.

Figure 3:
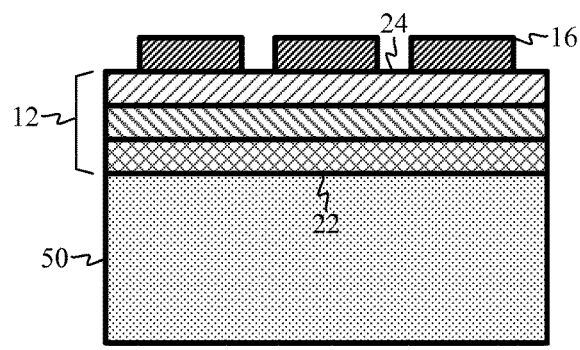
FIG. 3 is a schematic cross-sectional view of the solar cell structure of FIG. 1 during a second step of manufacture.

As shown in FIG. 3, the back contacts 16 may be formed on the back surface 24 of the solar cell 12 using, for example, standard photolithography and metal deposition technology. While retaining low electrical contact and series resistance, the metal coverage on the back surface 24 of the solar cell 12 may be as low as possible, thereby allowing light transmitted to the reflective layer 20 to be reflected back to the solar cell 12 to be absorbed one more time or leaked out from the front surface 22 of the solar cell 12. For example, the back contacts 16 may be configured as metal gridlines with a contact pad for electrical current extraction. A typical back contact metal stack may include titanium, platinum and gold.

Figure 4:
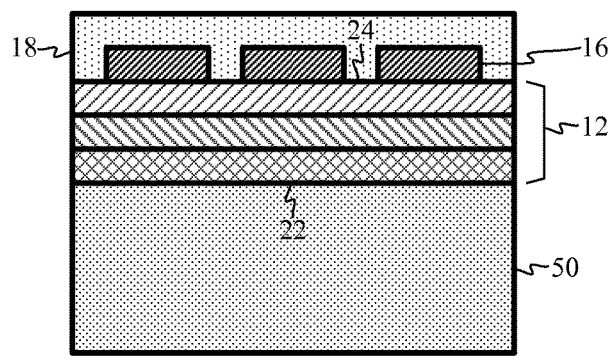
FIG. 4 is a schematic cross-sectional view of the solar cell structure of FIG. 1 during a third step of manufacture.

As shown in FIG. 4, the flexible support layer 18 may be formed over the back contacts 16 on the back surface 24 of the solar cell 12. For example, as discussed above, the flexible support layer 18 may be formed by spin-coating polyimide (e.g., PI-2611 polyimide) on to the solar cell 12, followed by a curing step.

Figure 5:
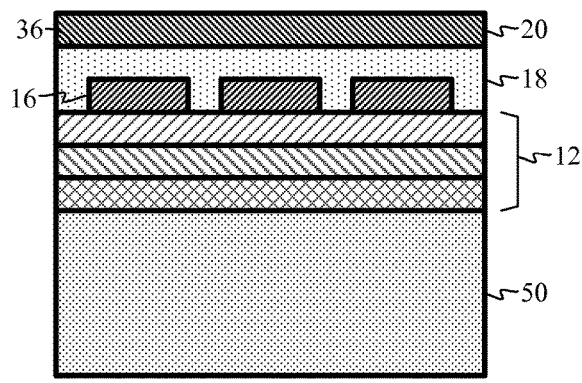
FIG. 5 is a schematic cross-sectional view of the solar cell structure of FIG. 1 during a fourth step of manufacture.

As shown in FIG. 5, the reflective layer 20 may be formed over the back surface 36 of the flexible support layer 18. For example, the reflective layer 20 may be formed by evaporation or sputtering a reflective metal, such as gold, onto the back surface 26 of the flexible support layer 18.

Figure 6:
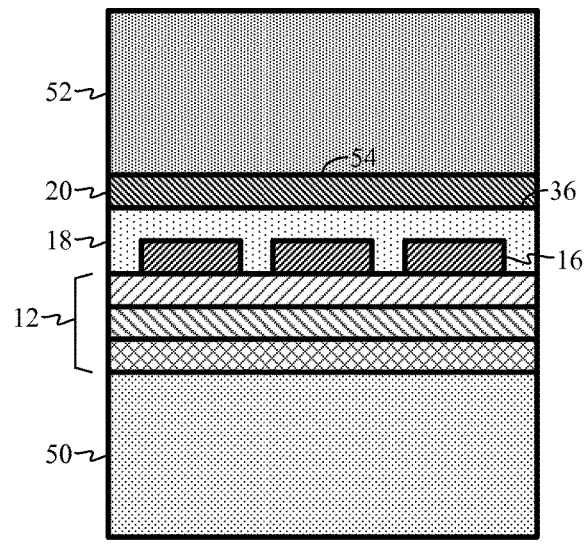
FIG. 6 is a schematic cross-sectional view of the solar cell structure of FIG. 1 during a fifth step of manufacture.

As shown in FIG. 6, a temporary handle wafer 52 may be attached to the back surface 54 of the reflective layer 20. For example, the temporary handle wafer 52 may be glass or silicon, depending on the handle wafer de-bonding process, and may be attached to the reflective layer 20 by wax or other adhesives.

Figure 7:
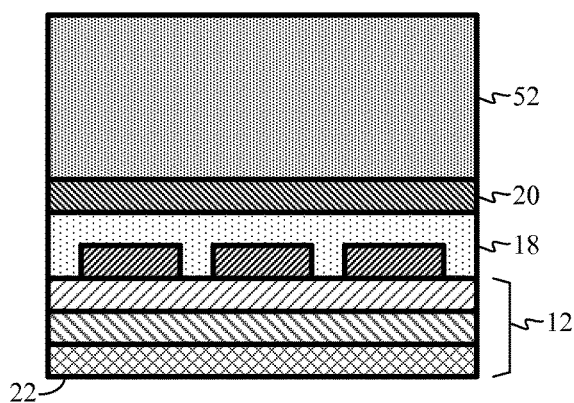
FIG. 7 is a schematic cross-sectional view of the solar cell structure of FIG. 1 during a sixth step of manufacture.

After the temporary handle wafer 52 has been attached, the temporary substrate 50 may be removed, as shown in FIG. 7. For example, the temporary substrate 50 may be removed by chemical etching or a combination of mechanical and chemical etching.

Figure 8:
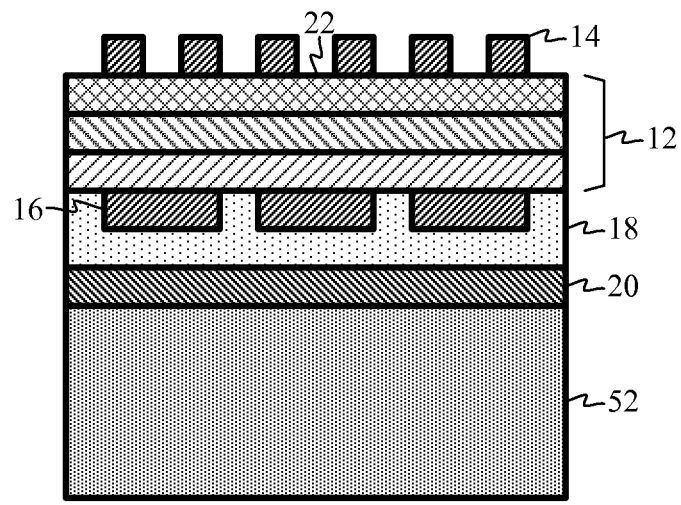
FIG. 8 is a schematic cross-sectional view of the solar cell structure of FIG. 1 during a seventh step of manufacture.

As shown in FIG. 8, with the temporary substrate 50 removed, the front contacts 14 may be applied to the front surface 22 of the solar cell 12. For example, the front contacts 14 may be formed as metal gridlines. A metal stack composed of Pd, Ge, Au and Ag may be used as front contact in one demonstration of the disclosed solar cell structure. At this point, those skilled in the art will appreciate that additional steps, such as cap etching and antireflection coating, may also be performed on the exposed front surface 22 of the solar cell 12.

Figure 9:
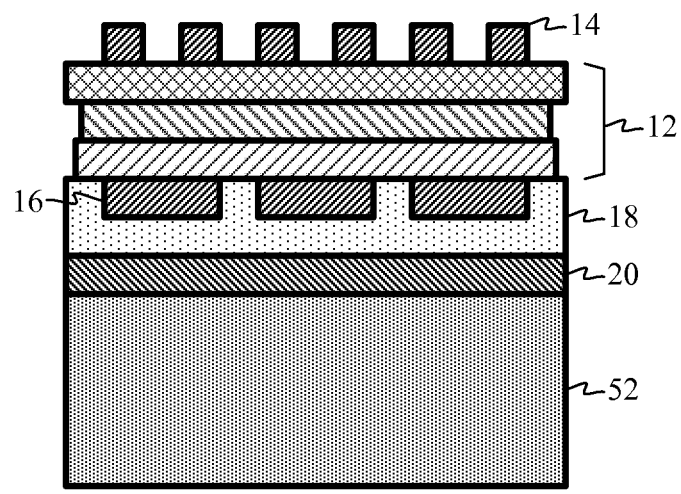
FIG. 9 is a schematic cross-sectional view of the solar cell structure of FIG. 1 during a eighth step of manufacture.

As shown in FIG. 9, the solar cell 12 may be electrically separated using, for example, a chemical etch.

Finally, as shown in FIG. 1, the temporary handle wafer 52 may be removed using, for example, mechanical force or soaking in solvent. Furthermore, the contacts 14, 16 may be sintered and the solar cell structure 10 may be cut to the desired size and shape.

Accordingly, the disclosed solar cell structure 10 may include a flexible support layer 18 for mechanically supporting the solar cell 12, such as a thin, flexible inverted metamorphic solar cell, and a reflective layer 20 for redirecting incoming light back to the solar cell 12, thereby increasing efficiency and reducing heat accumulating within the solar cell structure 10. Furthermore, in inverted metamorphic solar cell applications, the base of the lowest bandgap metamorphic cell may purposefully be grown thinner, due to the incorporation of the reflective layer 20.

Although various aspects of the disclosed solar cell structure and method have been shown and described, modifications may occur to those skilled in the art upon reading the specification. The present application includes such modifications and is limited only by the scope of the claims.

What is claimed is:

1. An inverted metamorphic solar cell structure comprising:
   a solar cell comprising a top subcell, a middle subcell, and a bottom subcell, the solar cell having a front surface, a first back surface and having a first coefficient of thermal expansion, wherein the first back surface includes spaced apart contacts thereby defining gaps allowing light to transmit between the contacts;
   a flexible support layer adjacent the first back surface and thereby defining a second back surface, the flexible support layer has a cross-sectional thickness ranging from about 5 µm to about 20 µm; and
   a reflective layer adjacent the second back surface, the reflective layer has a cross-sectional thickness of from about 0.1 µm to about 2 µm;
   wherein the flexible support layer has a second coefficient of thermal expansion compatible with the first coefficient of thermal expansion;
   wherein the reflective layer comprises gold or silver and receives incoming light passing through the solar cell and the gaps between the contacts and reflects the incoming light back to the solar cell through the gaps between the contacts;
   wherein a base of the lowest bandgap metamorphic cell is grown thinner than a solar cell without a reflective layer because of the presence of the reflective layer.

2. The solar cell structure of claim 1 wherein the second coefficient of thermal expansion varies from the first coefficient of thermal expansion by at most 50 percent in terms of a ppm/° C. value.

3. The solar cell structure of claim 1 wherein the first coefficient of thermal expansion is from about 5 to about 7 ppm/° C.

4. The solar cell structure of claim 3 wherein the second coefficient of thermal expansion is about 3 ppm/° C.

5. The solar cell structure of claim 1 wherein the flexible support layer has a light absorption of at most 10 percent at a wavelength at or above 900 nanometers.

6. The solar cell structure of claim 1 wherein the reflective layer has a reflectance of at least 90 percent at wavelengths at and above 750 nanometers.

7. The solar cell structure of claim 6 wherein the reflective layer has a reflectance of at least 95 percent at wavelengths at and above 750 nanometers.

8. The solar cell structure of claim 7 wherein the reflective layer has a reflectance of at least 97 percent at wavelengths at and above 750 nanometers.

9. The solar cell structure of claim 1 wherein the flexible support layer comprises a polyimide.

10. The solar cell structure of claim 1 wherein the flexible support layer includes more than one layer of support material and the support material thereof that defines the second back surface is sufficiently smooth to receive and support the reflective layer.

11. The solar cell structure of claim 1 having sufficient flexibility to be free of naked-eye-detectable damage when the structure is mounted in overlaying relationship on a cylindrical surface wherein the diameter of a cylinder defining the cylindrical surface is from 10 inches to 20 inches.

12. The solar cell structure of claim 11 wherein the diameter is 10 inches.

13. The solar cell structure of claim 11 wherein the diameter is 15 inches.

14. The solar cell structure of claim 11 wherein the diameter is 20 inches.

15. A method for manufacturing the solar cell structure according to claim 1 comprising:
   attaching the front surface of the solar cell to a temporary substrate;
   forming a flexible support layer on the back surface;
   forming a reflective layer on the flexible support layer; and
   removing the temporary substrate from the front surface.

16. A solar cell structure comprising:
   a high-efficiency multi junction solar cell comprising a top subcell, a middle subcell, and a bottom subcell and having a front surface and a first back surface, wherein the first back surface includes spaced apart contacts thereby defining gaps allowing light to transmit between the contacts;
   a flexible support layer adjacent to the first back surface and thereby defining a second back surface and wherein the flexible support layer comprises a polyimide; and
   a reflective layer disposed on the second back surface, the reflective layer has a cross-sectional thickness of from about 0.1 µm to about 2 µm and comprising gold or silver;
   wherein the reflective layer receives incoming light passing through the solar cell and the gaps between the contacts and reflects the incoming light back to the solar cell through the gaps between the contacts;

wherein a base of the lowest bandgap metamorphic cell is grown thinner than a solar cell without a reflective layer because of the presence of the reflective layer.

17. The solar cell structure of claim 16 wherein the flexible support material has a light absorption of at most 10 percent at a wavelength at or above 900 nanometers.

18. The solar cell structure of claim 16 wherein the solar cell has a first coefficient of thermal expansion of about 5 to about 7 ppm/° C. and the flexible support layer has a second coefficient of thermal expansion of about 3 ppm/° C.

* * * * *